United States Patent
Lee et al.

(10) Patent No.: US 8,119,503 B2
(45) Date of Patent: Feb. 21, 2012

(54) METHODS OF FORMING INTEGRATED CIRCUIT DEVICES HAVING VERTICAL SEMICONDUCTOR INTERCONNECTS AND DIODES THEREIN AND DEVICES FORMED THEREBY

(75) Inventors: Kong-Soo Lee, Gyeonggi-do (KR); Kyoung-Seok Kim, Seoul (KR); Sang-Jin Park, Gyeonggi-do (KR); Chang-Hoon Lee, Gyeonggi-do (KR); Ji-Hyun Jeong, Seoul (KR); Jae-Hyun Park, Gyeonggi-do (KR); Jae-Hee Oh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 160 days.

(21) Appl. No.: 12/498,528

(22) Filed: Jul. 7, 2009

(65) Prior Publication Data

US 2010/0108971 A1 May 6, 2010

(30) Foreign Application Priority Data

Oct. 31, 2008 (KR) .................. 2008-107856

(51) Int. Cl.
*H01L 47/00* (2006.01)
*H01L 21/20* (2006.01)
(52) U.S. Cl. . 438/478; 257/2; 257/E21.09; 257/E47.001
(58) Field of Classification Search ......... 257/2, E21.09, 257/E47.001; 438/478
See application file for complete search history.

(56) References Cited

U.S. PATENT DOCUMENTS

| | | | |
|---|---|---|---|
| 7,679,075 B2 * | 3/2010 | Chao | 257/4 |
| 7,867,841 B2 * | 1/2011 | Lim et al. | 438/222 |
| 2006/0008975 A1 * | 1/2006 | Gonzalez et al. | 438/237 |
| 2008/0078984 A1 | 4/2008 | Park et al. | |
| 2008/0113469 A1 | 5/2008 | Eun et al. | |
| 2008/0318003 A1 * | 12/2008 | Chua et al. | 428/141 |
| 2010/0133509 A1 * | 6/2010 | Kawashima et al. | 257/24 |

FOREIGN PATENT DOCUMENTS

| | | |
|---|---|---|
| JP | 2002-093819 | 3/2002 |
| KR | 10-0766504 B1 | 10/2007 |
| KR | 10-2008-0002063 A | 1/2008 |

* cited by examiner

*Primary Examiner* — Matthew W Such
*Assistant Examiner* — Monica D Harrison
(74) *Attorney, Agent, or Firm* — Myers Bigel Sibley & Sajovec, P.A.

(57) ABSTRACT

Methods of forming integrated circuit devices include forming an etch stop layer on a surface of a semiconductor substrate and forming a first interlayer insulating layer on the etch stop layer. The first interlayer insulating layer is patterned to define an opening therein that exposes a first portion of the etch stop layer. This first portion of the etch stop layer is then removed to thereby expose an underlying portion of the surface of the semiconductor substrate. This removal of the etch stop layer may be performed by wet etching the first portion of the etch stop layer using a phosphoric acid solution. A semiconductor region is then selectively grown into the opening, using the exposed portion of the surface of the semiconductor substrate as an epitaxial seed layer.

19 Claims, 6 Drawing Sheets

METHODS OF FORMING INTEGRATED CIRCUIT DEVICES HAVING VERTICAL SEMICONDUCTOR INTERCONNECTS AND DIODES THEREIN AND DEVICES FORMED THEREBY

REFERENCE TO PRIORITY APPLICATION

This application claims priority to Korean Patent Application No. 2008-107856, filed Oct. 31, 2008, the disclosure of which is hereby incorporated herein by reference.

FIELD OF THE INVENTION

The present invention relates to integrated circuit devices and methods of forming same and, more particularly, to integrated circuit memory devices and methods of forming same.

BACKGROUND OF THE INVENTION

Integrated circuit memory devices are typically formed as volatile memory devices that lose stored data after power interruption or nonvolatile memory devices that retain stored data after power interruption. Many of these nonvolatile memory devices may utilize non-volatile memory cells having material properties that support nonvolatile data storage. For example, some nonvolatile memory cells may utilize phase-changeable materials, such as chalcogenide materials, to store a logic state (e.g., "0" or "1") of the memory cell. These memory cells are typically classified as phase-changeable random access memory (PRAM) cells. In some of these memory cells, a switch (e.g., diode) is provided in series with a phase changeable material. To achieve high levels of integration, this switch may be formed using a vertical stack of layers. Some examples of conventional PRAM cells are disclosed in US 2008/0078984 to Park et al., entitled "Semiconductor Device and Method of Fabricating the Same;" and in US 2008/0113469 to Eun et al., entitled "Methods of Fabricating a Semiconductor Device Including a Self-Aligned Cell Diode."

SUMMARY OF THE INVENTION

Methods of forming integrated circuit devices according to embodiments of the present invention include forming an etch stop layer on a surface of a semiconductor substrate and forming a first interlayer insulating layer on the etch stop layer. This step of forming an etch stop layer may be preceded by a step of forming an oxide buffer layer on the surface of the semiconductor substrate. The first interlayer insulating layer is patterned to define at least one vertical opening therein that exposes a first portion of the etch stop layer. This first portion of the etch stop layer is then removed to thereby expose an underlying portion of the surface of the semiconductor substrate. This removal of the etch stop layer may be performed by wet etching the first portion of the etch stop layer using a phosphoric acid solution, for example. A semiconductor region is then selectively grown into the vertical opening, using the exposed portion of the surface of the semiconductor substrate as an epitaxial seed.

According to some of these embodiments of the present invention, the etch stop layer includes an electrically insulating nitride layer and the step of removing the first portion of the etch stop layer includes forming an undercut opening (e.g., recess) between the first interlayer insulating layer and the exposed portion of the surface of the semiconductor substrate. This can be done by laterally recessing the etch stop layer relative to a sidewall of the opening in the first interlayer insulating layer. Based on these steps, the step of selectively growing the semiconductor region includes laterally growing a portion of the semiconductor region into the undercut opening concurrently with vertically growing the semiconductor region into the vertical opening. This step of selectively growing the semiconductor region may also be preceded by a step of cleaning the exposed portion of the surface of the semiconductor substrate using a cleaning solution. This cleaning solution may include hydrofluoric acid.

According to still further embodiments of the present invention, the step of selectively growing the semiconductor region may include epitaxially growing an in-situ doped first semiconductor region of first conductivity type into the vertical opening and epitaxially growing an in-situ doped second semiconductor region of second conductivity type onto the first semiconductor region to thereby define an P-N rectifying junction between the first and second semiconductor regions. Additional embodiments of the present invention may include implanting first conductivity type dopants into the semiconductor region at a first dose level and a first energy level and implanting second conductivity type dopants into the semiconductor region at a second dose level and second energy level less than the first energy level. An annealing step may also be performed to thereby activate the first and second conductivity type dopants and define a P-N rectifying junction therein.

According to still further embodiments of the present invention, a method of forming a nonvolatile memory device may include forming a nitride layer on a surface of a semiconductor substrate and forming a first interlayer insulating layer on the nitride layer. The first interlayer insulating layer is then patterned to define an opening therein that exposes a first portion of the nitride layer. The first portion of the nitride layer is then removed to thereby expose an underlying portion of the surface of the semiconductor substrate. A semiconductor diode is then formed in the opening, by selectively growing a semiconductor region into the opening and doping the semiconductor region with N-type and P-type dopants. The first portion of the nitride layer may be removed by vertically etching and laterally etching the nitride layer to expose the surface of the semiconductor substrate and define an undercut opening between the first interlayer insulating layer and the surface. In addition, the step of forming a semiconductor diode may be preceded by a step of lining the sidewall of the opening with an electrically insulating sidewall spacer layer. This step of lining the sidewall of the opening may include at least partially filling the undercut opening with the electrically insulating sidewall spacer layer. This step of lining the sidewall of the opening may also be followed by a step of selectively etching the electrically insulating sidewall spacer layer in the opening to again expose the surface of the semiconductor substrate. The step of selectively growing a semiconductor region into the opening may also include selectively growing the semiconductor region using the exposed portion of the surface of the semiconductor substrate as an epitaxial seed.

Still further embodiments of the present invention include forming a nonvolatile memory device by forming a nitride layer on a surface of a semiconductor substrate and forming a first interlayer insulating layer on the nitride layer. The first interlayer insulating layer is patterned to define an opening therein that exposes a first portion of the nitride layer. The first portion of the nitride layer is removed to thereby expose an underlying portion of the surface of the semiconductor substrate. This removing may include laterally etching the nitride layer to define an undercut region between the first interlayer insulating layer and the surface of the semiconductor substrate. A semiconductor diode may be formed in the opening by selectively growing a semiconductor region into the opening and undercut region and doping the semiconductor region with N-type and P-type dopants.

Additional embodiments of the present invention may include integrated circuit memory devices having semiconductor diodes therein. According to some of these embodiments of the invention, an interlayer insulating layer (oxide layer) is provided on a surface of a semiconductor substrate. The interlayer insulating layer has at least one vertical opening therein that is filled with a vertical semiconductor diode (e.g., P-N junction diode) having a region of first conductivity type therein electrically coupled to the semiconductor substrate. An etch-stop layer, which is formed of a different material relative to the interlayer insulating layer, extends between the interlayer insulating layer and the surface of the semiconductor substrate. The etch-stop layer has an undercut opening therein, which is laterally recessed relative to a sidewall of the opening in the interlayer insulating layer. An undercut spacer is provided that fills the undercut opening. The undercut spacer is formed of a different material relative to the etch-stop layer. A memory storage element is also provided, which is electrically coupled to the vertical semiconductor diode.

DETAILED DESCRIPTION OF PREFERRED EMBODIMENTS

Figure 1A:
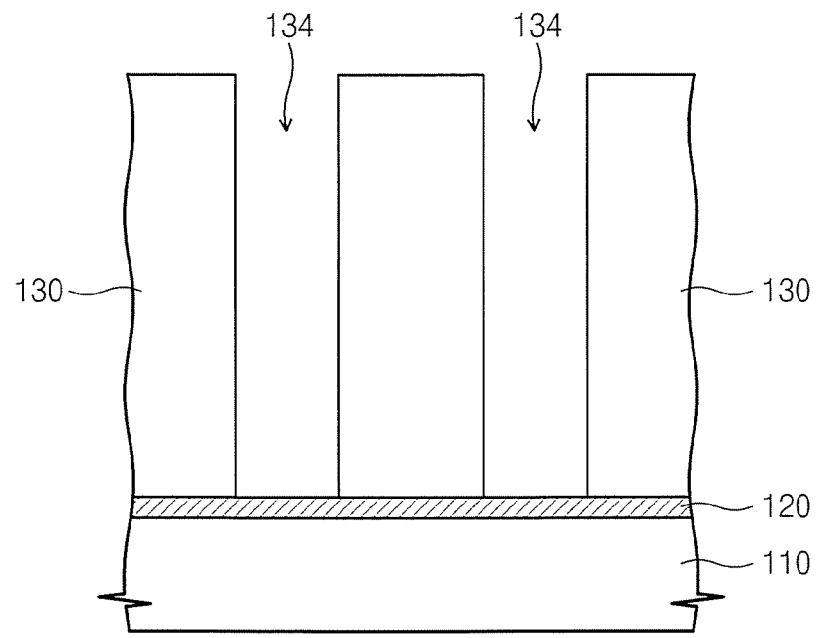
FIGS. 1A-1G are cross-sectional views of intermediate structures that illustrate methods of forming integrated circuit devices according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 1B:
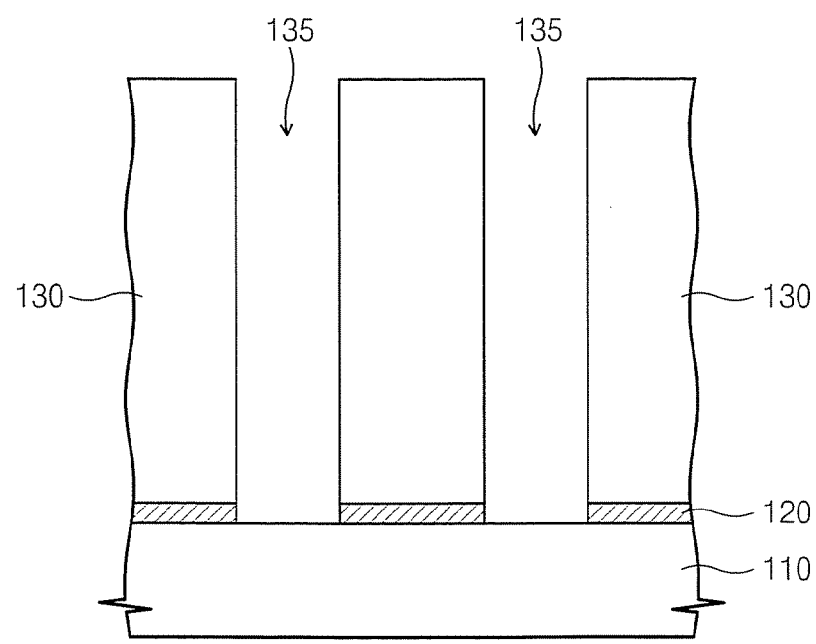

Methods of forming integrated circuit devices according to embodiments of the present invention are illustrated by FIGS. 1A-1G. As illustrated by FIG. 1A, an etch-stop layer 120 (e.g., silicon nitride) is formed on a primary surface of a semiconductor substrate 110, which may have doped semiconductor regions (not shown) therein that may provide electrical interconnection within the substrate 110. This etch-stop layer 120 may be formed to have a thickness in a range from about 10 Å to about 500 Å. An interlayer insulating layer(s) 130 (e.g., silicon dioxide) is formed on the etch-stop layer 120. The interlayer insulating layer 130 is preferably formed of a material having a high degree of etching selectivity relative to the etch-stop layer 120. This interlayer insulating layer 130 is patterned to define openings 134 therein that exposes a first portion(s) of the etch stop layer 120. Referring now to FIG. 1B, the first portion(s) of the etch stop layer 120 is then removed to thereby expose an underlying portion of the surface of the semiconductor substrate 110 within an opening 135 and, in at least some cases, expose the doped semiconductor regions (not shown). This removal of the first portion of the etch-stop layer 120 may be performed by wet etching the first portion of the etch-stop layer 120 using a phosphoric acid solution ($H_3PO_4$). Although not shown in FIGS. 1A-1B, a buffer layer (e.g., oxide) may be formed between the substrate 110 and the etch-stop layer 120 in order to reduce interface stress between the etch-stop layer 120 and the substrate 110.

Figure 1C:
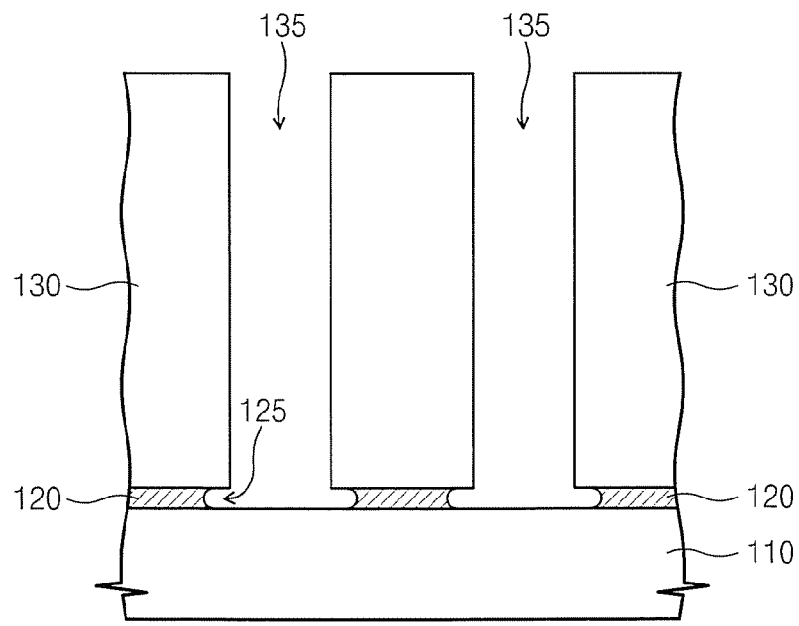
Figure 1D:
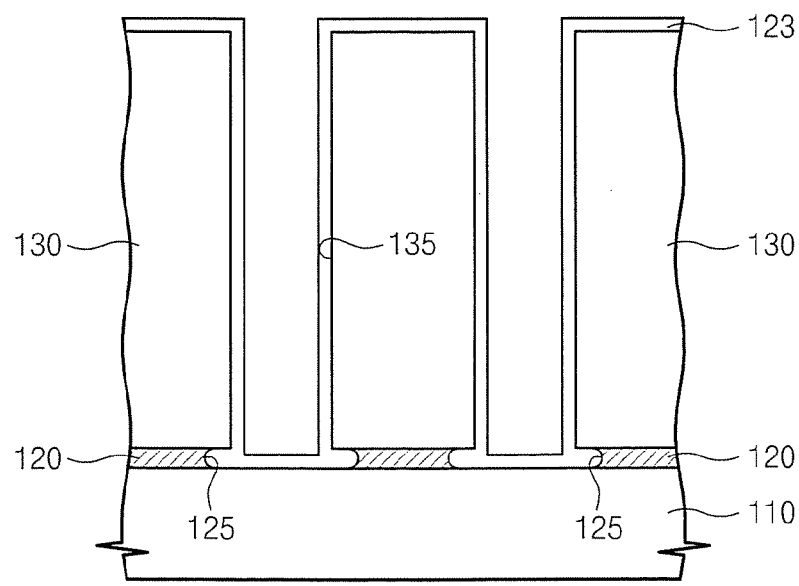

As illustrated by FIG. 1C, the wet etching of the etch-stop layer 120 may result in the formation of an undercut opening 125 between the interlayer insulating layer 130 and the exposed portion of the surface of the semiconductor substrate 110. Thus, the wet etching may operate to define a lateral recession of the etch stop layer 120 relative to a sidewall of the opening 135 in the interlayer insulating layer 130. Thereafter, as illustrated by FIG. 1D, an electrically insulating spacer layer 123 may be conformally deposited on the structure of FIG. 1C. This spacer layer 123, which may be a silicon dioxide layer having a thickness in a range from about 10 Å to about 300 Å, lines the sidewalls of the openings 135 and may contact the exposed portions of the surface of the semiconductor substrate 110, as illustrated. The spacer layer 123 may also be deposited to fill the undercut openings 125. To achieve filling of the undercut openings 125, the spacer layer 123 may be deposited using a low-pressure chemical vapor deposition (LPCVD) technique.

Figure 1E:
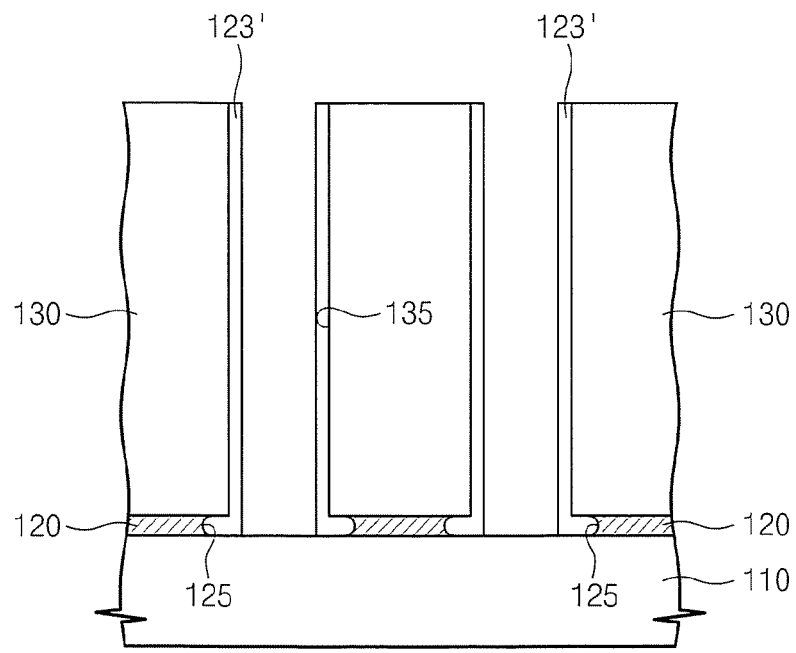
Figure 1F:
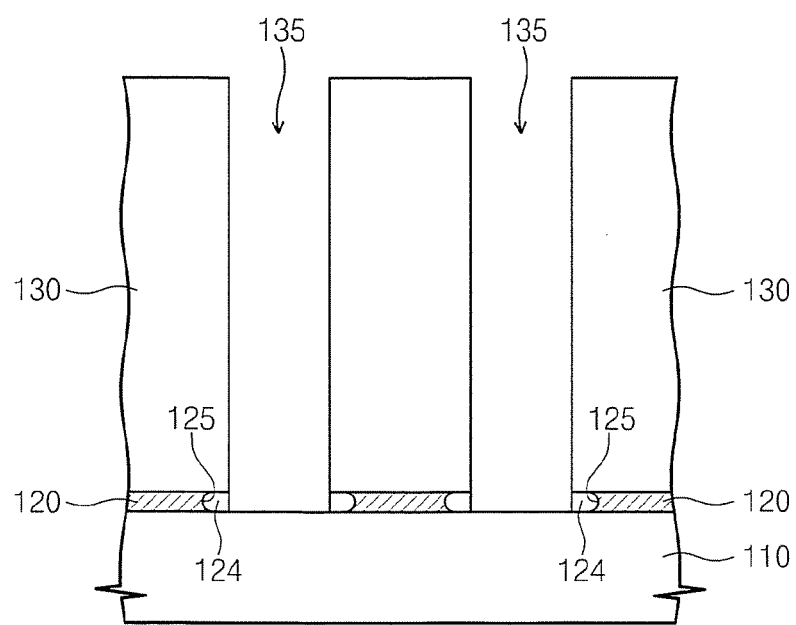

Referring now to FIG. 1E, the electrically insulating spacer layer 123 may be anisotropically etched (e.g., by dry etching) to remove portions of the spacer layer 123 from an upper surface of the interlayer insulating layer 130 and from the bottoms of the openings 135, and thereby define modified sidewall spacers 123'. In some embodiments of the invention, an optional isotropic etching step (e.g., wet etching) may be performed to further remove portions of the spacer layer 123 from the bottoms and sidewalls of the openings 135 and thereby expose the sidewalls of the interlayer insulating layer 130, as illustrated by FIG. 1F. However, the duration of this wet etching step, if any, should be insufficient to cause exposure of the recessed etch-stop layers 120 in the undercut openings 125. In particular, the wet etching step may be performed to yield electrically insulating undercut spacers 124 that at least partially fill the undercut openings 125.

Figure 1G:
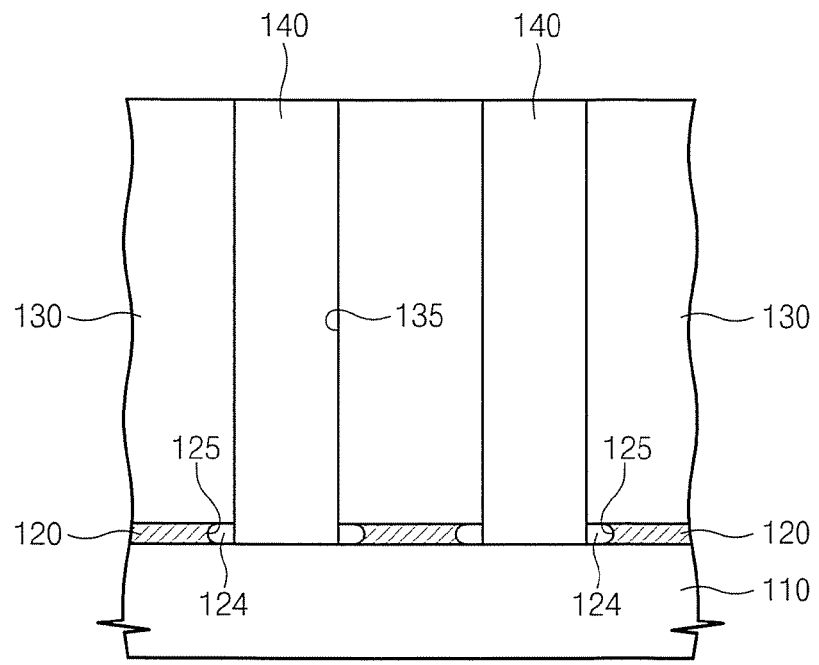

Referring now to FIG. 1G, semiconductor regions 140 are formed to fill the openings 135. As illustrated, these semiconductor regions 140 electrically contact respective portions of the underlying semiconductor substrate 110, such as the doped semiconductor regions (not shown), and may form non-rectifying homogenous semiconductor junctions therewith. For example, the substrate 110 may be formed as a silicon substrate and the semiconductor regions 140 may be formed by epitaxially growing silicon regions into the openings 135 using the exposed portions of the substrate 110 as respective epitaxial seed layers. Advantageously, during epitaxial growth, the semiconductor regions 140 are protected from contamination by the recessed etch-stop layers 120 by the presence of the undercut spacers 124. These epitaxial growth steps may be preceded by a step of cleaning the exposed portions of the substrate 110 using a hydrofluoric acid (HF) solution.

Figure 1H:
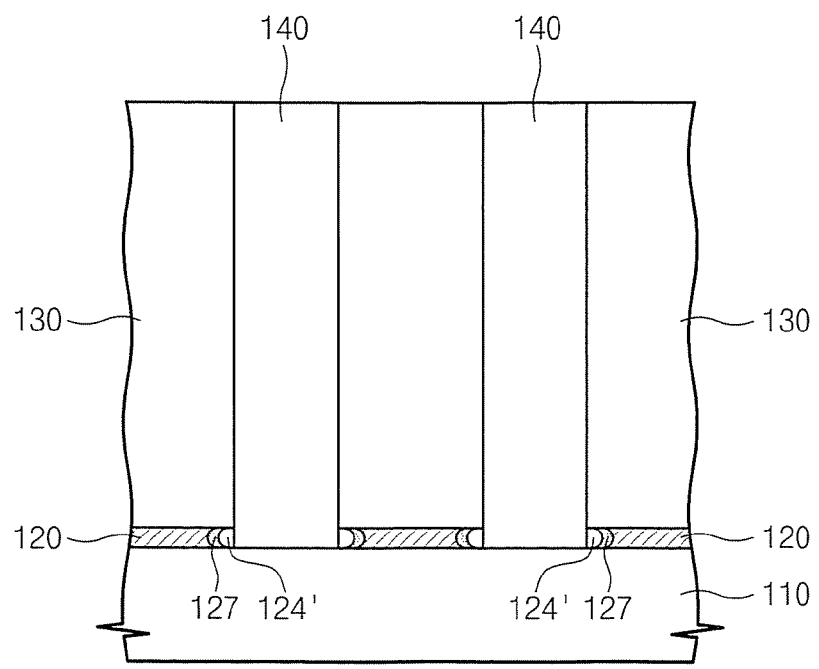
FIG. 1H is a cross-sectional view of an intermediate structure that illustrates methods of forming integrated circuit devices according to additional embodiments of the present invention.

According to still further embodiments of the present invention, an additional spacer material may be formed between the semiconductor regions 140 and the recessed etch-stop layers 120. In particular, as illustrated by FIG. 1H, intermediate spacers 127 may be formed between undercut spacers 124' and the etch-stop layers 120. These intermediate spacers 127 may be formed of a material that is different from the material of the etch-stop layers 120 and different from the material of the undercut spacers 124'. In some embodiments of the invention, the intermediate spacers 127 may be formed by thermally oxidizing or otherwise treating exposed portions of the etch-stop layers 120 in the undercut openings 125 in advance of depositing the spacer layer 123 illustrated by FIG. 1D. For example, the intermediate spacers 127 may be formed as silicon oxynitride (SiON) spacers.

Figure 2:
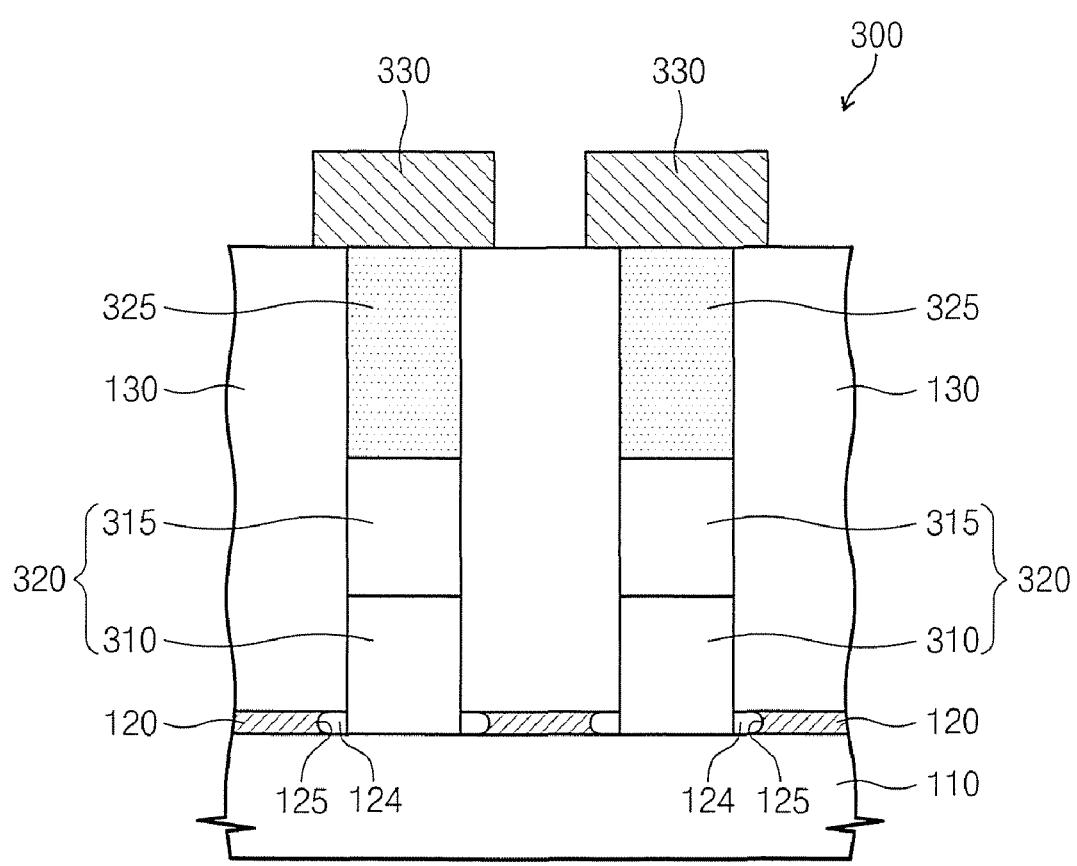
FIG. 2 is a cross-sectional view of an integrated circuit memory device according to an embodiment of the present invention.

FIG. 2 is a cross-sectional view of an integrated circuit memory device 300 device (e.g., PRAM, RRAM) according to an embodiment of the present invention. This memory device 300 may be formed using the method embodiments illustrated by FIGS. 1A-1H. In particular, each semiconductor region 140 illustrated by FIG. 1G may be formed as a semiconductor P-N diode 320 and a semiconductor connecting region 325 on the semiconductor diode 320. The semiconductor connecting regions 325 provide a relatively low resistance path between respective memory storage elements 330 and diodes 320. In some embodiments of the invention, the memory storage elements 330 may include phase-changeable (e.g., chalcogenide) materials. Each semiconductor diode 320 is illustrated as including a first semiconductor region 310 of first conductivity type (e.g., N-type) and a second semiconductor region 315 of second conductivity type (e.g., P-type) that forms a rectifying junction with the first semiconductor region 310. These first and second semiconductor regions 310 and 315 of opposite conductivity type may be formed as in-situ doped regions that are sequentially formed during the epitaxial growth step. Alternatively, the opposite conductivity type regions may be formed by implanting dopants (e.g., N-type, P-type) at respective relatively high and low implant energies into the semiconductor regions 140, after the semiconductor regions 140 have been fully formed. An annealing step may also be performed to activate the dopants.

Figure 3:
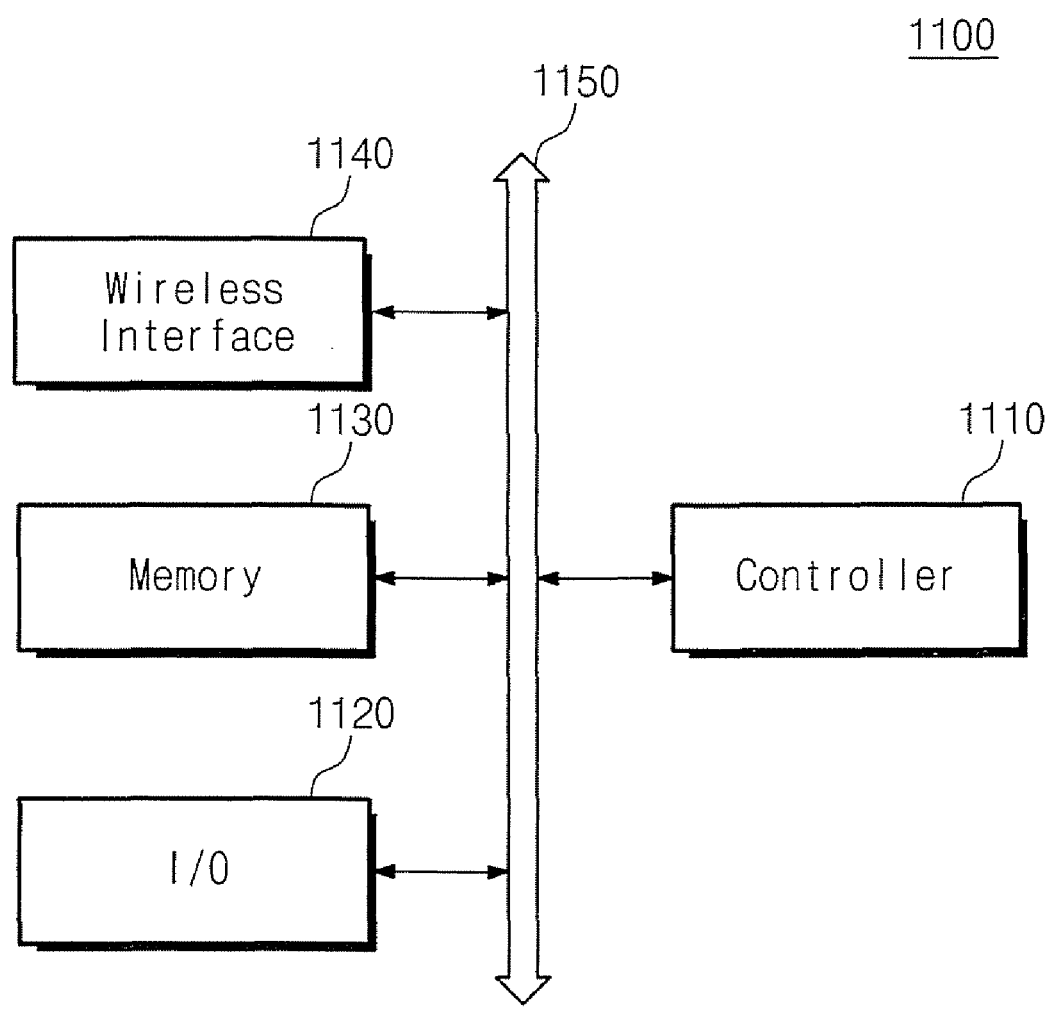
FIG. 3 is a block diagram of an integrated circuit system that may use memory devices according to embodiments of the present invention.

FIG. 3 is a block diagram of an embodiment of a integrated circuit system 1100 that may use the memory devices 300 of FIG. 2 within a memory device 1130. As illustrated, this memory device 1130 may be coupled to a system bus 1150, which is communicatively coupled to a wireless interface circuit 1140, an input/output circuit 1120 and a controller 1110. Other system configurations that may use the devices of FIGS. 1G-1H and 2 may also be provided, according to additional embodiments of the invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising:
   forming an electrically insulating etch stop layer on a surface of a semiconductor substrate;
   forming a first interlayer insulating layer on the etch stop layer;
   patterning the first interlayer insulating layer to define an opening therein that exposes a first portion of the etch stop layer;
   removing the first portion of the etch stop layer to thereby expose an underlying portion of the surface of the semiconductor substrate, said removing comprising forming an undercut opening between the first interlayer insulating layer and the exposed portion of the surface of the semiconductor substrate by laterally recessing the etch stop layer relative to a sidewall of the opening in the first interlayer insulating layer; and
   selectively growing a semiconductor region into the opening, using the exposed portion of the surface of the semiconductor substrate as an epitaxial seed layer.

2. The method of claim 1, wherein said selectively growing comprises laterally growing a portion of the semiconductor region into the undercut opening.

3. The method of claim 1, wherein said selectively growing is preceded by a step of cleaning the exposed portion of the surface of the semiconductor substrate using a cleaning solution.

4. The method of claim 3, wherein the cleaning solution comprises hydrofluoric acid.

5. The method of claim 1, wherein said forming an etch stop layer is preceded by forming an oxide buffer layer on the surface of the semiconductor substrate.

6. The method of claim 1, wherein said removing comprises wet etching the first portion of the etch stop layer using a phosphoric acid solution.

7. The method of claim 1, wherein said selectively growing comprises:
   epitaxially growing an in-situ doped first semiconductor region of first conductivity type into the opening; and
   epitaxially growing an in-situ doped second semiconductor region of second conductivity type onto the first semiconductor region to thereby define an P-N rectifying junction between the first and second semiconductor regions.

8. The method of claim 1, wherein said selectively growing is followed by the steps of:
   implanting first conductivity type dopants into the semiconductor region at a first dose level and a first energy level; and
   implanting second conductivity type dopants into the semiconductor region at a second dose level and second energy level less than the first energy level.

9. The method of claim 8, further comprising annealing the semiconductor region to thereby activate the first and second conductivity type dopants and define a P-N rectifying junction therein.

10. A method of forming a nonvolatile memory device, comprising:
   forming a nitride layer on a surface of a semiconductor substrate;
   forming a first interlayer insulating layer on the nitride layer;
   patterning the first interlayer insulating layer to define an opening therein that exposes a first portion of the nitride layer;
   removing the first portion of the nitride layer to thereby expose an underlying portion of the surface of the semiconductor substrate; and
   forming a semiconductor diode in the opening, by selectively growing a semiconductor region into the opening and doping the semiconductor region with N-type and P-type dopants.

11. The method of claim 10, wherein said removing comprises laterally etching the nitride layer to define an undercut opening between the first interlayer insulating layer and the surface of the semiconductor substrate.

12. The method of claim 11, wherein said forming a semiconductor diode is preceded by a step of lining the sidewall of the opening with an electrically insulating sidewall spacer layer.

13. The method of claim 12, wherein said lining the sidewall of the opening comprises at least partially filling the undercut opening with the electrically insulating sidewall spacer layer.

14. The method of claim 13, wherein said lining the sidewall of the opening is followed by a step of selectively etching the electrically insulating sidewall spacer layer in the opening to thereby expose the surface of the semiconductor substrate.

15. The method of claim 10, wherein selectively growing a semiconductor region into the opening comprises selectively growing the semiconductor region using the exposed portion of the surface of the semiconductor substrate as an epitaxial seed.

16. A method of forming a nonvolatile memory device, comprising:
    forming a nitride layer on a surface of a semiconductor substrate;
    forming a first interlayer insulating layer on the nitride layer;
    patterning the first interlayer insulating layer to define an opening therein that exposes a first portion of the nitride layer;
    removing the first portion of the nitride layer to thereby expose an underlying portion of the surface of the semiconductor substrate, said removing comprising laterally etching the nitride layer to define an undercut region between the first interlayer insulating layer and the surface of the semiconductor substrate; and
    forming a semiconductor diode in the opening, by selectively growing a semiconductor region into the opening and undercut region and doping the semiconductor region with N-type and P-type dopants.

17. An integrated circuit memory device, comprising:
    an interlayer insulating layer on a surface of a semiconductor substrate, said interlayer insulating layer having an opening therein that is filled with a vertical semiconductor diode having a region of first conductivity type therein electrically coupled to the semiconductor substrate;
    an etch-stop layer comprising a different material relative to said interlayer insulating layer, said etch-stop layer extending between said interlayer insulating layer and the surface of the semiconductor substrate and having an undercut opening therein that is laterally recessed relative to a sidewall of the opening in said interlayer insulating layer;
    an undercut spacer filling the undercut opening, said undercut spacer comprising a different material relative to said etch-stop layer; and
    a memory storage element electrically coupled to the vertical semiconductor diode.

18. The memory device of claim 17, wherein said undercut spacer extends between the vertical semiconductor diode and a recessed sidewall of said etch-stop layer.

19. The memory device of claim 18, wherein said undercut spacer comprises a different material relative to said interlayer insulating layer.

* * * * *